United States Patent [19]

Sullivan

[11] Patent Number: 4,582,778
[45] Date of Patent: Apr. 15, 1986

[54] MULTI-FUNCTION PHOTOPOLYMER FOR EFFICIENTLY PRODUCING HIGH RESOLUTION IMAGES ON PRINTED WIRING BOARDS, AND THE LIKE

[76] Inventor: Donald F. Sullivan, 115 Cambridge Rd., King of Prussia, Pa. 19406

[21] Appl. No.: 545,169

[22] Filed: Oct. 25, 1983

[51] Int. Cl.[4] .................. G03C 1/495; G03C 1/94; G03C 1/90
[52] U.S. Cl. ............................ 430/273; 430/270; 430/275; 430/277; 430/312; 430/313; 430/314; 430/318; 430/319; 430/322; 430/329; 430/394; 430/502; 430/503
[58] Field of Search ............... 430/312, 316, 502, 394, 430/329, 260, 313, 314, 315, 318, 325, 261, 322, 503, 270, 273, 319, 952

[56] References Cited

U.S. PATENT DOCUMENTS

| | | | |
|---|---|---|---|
| 4,301,230 | 11/1981 | Taguchi et al. | 430/273 |
| 4,325,780 | 4/1982 | Schulz, Sr. | 156/659.1 |
| 4,349,620 | 9/1982 | Cyr et al. | 430/259 |
| 4,394,437 | 7/1983 | Bergendahl et al. | 430/312 |
| 4,413,051 | 11/1983 | Thomas | 430/312 |

FOREIGN PATENT DOCUMENTS

| | | | |
|---|---|---|---|
| 56-23746 | 3/1981 | Japan | 430/312 |
| 57-32635 | 2/1982 | Japan | 430/312 |

*Primary Examiner*—John E. Kittle
*Assistant Examiner*—José G. Dees
*Attorney, Agent, or Firm*—Laurence R. Brown

[57] ABSTRACT

A two layer photopolymer film pack is provided for producing a sequence of an intermediate and a final image on a substrate surface adjacent the film pack upon two successive cycles of exposure through a photo image pattern and development to remove soluble photopolymer. The two layers are of different photopolymers, which have differing solubility characteristics providing for both layers to be removed together by a first developing solution and only one layer to be removed by a different developing solution. This permits the process of this invention namely the successive exposure of a multi-layer photopolymer film to two different photo image patterns to develop intermediate and final hard photopolymer patterns for such methods as photomasking a printed wiring board by use of the intermediate step and producing high resolution printed wire traces in the final step covered by the photopolymer as an insulating solder mask layer. The two layers are of different thicknesses, a very thin layer thus affording very high circuit trace resolution. Two negative acting photopolymer layers are low in cost and sandwiched by an opaque film layer dissolvable in the first developing solution in one embodiment. In another embodiment a positive acting thin layer produces good resolution and a thicker polymer layer provides an electroplating barrier. Thus, a laminated printed wiring board assembly permits custom manufacture of specific circuit boards with less time, less cost, higher quality and fewer steps.

28 Claims, 4 Drawing Figures

U.S. Patent    Apr. 15, 1986    4,582,778

MULTI-FUNCTION PHOTOPOLYMER FOR EFFICIENTLY PRODUCING HIGH RESOLUTION IMAGES ON PRINTED WIRING BOARDS, AND THE LIKE

TECHNICAL FIELD

This invention relates to photopolymers and more particularly it relates to producing of high resolution images on substrates such as printed wiring boards with fewer processing steps.

BACKGROUND ART

Photopolymers are used for photoprinting patterns on various substrates and special polymers may be obtained for various operations. It has been the practice in the art to use a special photopolymer layer with corresponding processing steps for each step that requires differing operating conditions, such as high temperature for withstanding solder dip baths in the printed circuit arts and high resolution photoprinting of circuit traces where the photopolymer characteristics vary widely. Similar requirements for successive photo treatments of a single substrate can occur for two color prints, for example, where each color need be processed through a different photoprint. In such processes, considerable time, expense and quality control is required to clean, match and reprocess a substrate for a second photo process, thereby offsetting the other advantages of using photopolymers for photoprinting.

It is therefore a principle object of my invention to provide efficient multi-function photopolymers that efficiently produce high resolution images on substrates and in particular on printed wiring boards.

Other objects, features and advantages of the invention will be found throughout the following description, the drawing and the claims.

DISCLOSURE OF THE INVENTION

This invention therefore provides a multi-layer composite photopolymer film pack of diverse photopolymers achieving different photoprinting functions such as the ability to successively process with the same composite film pack two different photo images, one of which can be for defining land areas on a copper film clade printed wiring board and the other of which can be the high resolution printing of circuit traces not achievable with a plating resist type polymer. The multiple layers have different solubility or stripping characteristics so that they are selectively photo exposed and stripped in sequential operations in situ on a substrate to avoid interim cleaning or substrate handling problems and registration of successive photo images, etc.

Different combinations of positive acting photopolymer layers where light makes the photopolymer soluble and negative acting where light makes the photopolymer insoluble, together with different thicknesses of layers adapt to a wide range of photo techniques. Also, choices of dry film, liquid film, fast developing and photopolymer cost increase the range of operational advantages available from the photopolymer multiple layer film packs.

In processing a copper film clad fiberglass laminate as a printed wiring board several production steps can be eliminated by such a substrate precoated with a multi-layer composite photopolymer at a considerable cost saving and with better assurance of quality control. Thus, the process steps are typically the photo exposure of the outer layer, and developing that pattern down to the surface of the substrate, and the performance of one chemical processing step such as electroplating. The remaining outer layer is stripped with a different solution, and this has no significant effect on the inner layer, which is now ready for exposure through a second image pattern, and when developed a second pattern of substrate is uncovered, and a second chemical operation is performed; for example, metal film etching. With a very thin inner layer of low cost negative acting liquid photopolymer such as 0.00025 inch (0.001 cm) in thickness, resolutions of 0.001 inch (0.0025 cm) can be readily attained. Thicker outer layers may be advantageous for a first step of copper and solder electroplating.

The multi-layer film packs separate inner and outer photopolymer layers by an opaque film such as a resin to prevent premature inner layer exposure. A first developer solution can selectively remove all three layers down to the substrate, which if a printed wiring board is a copper film that can be plated or etched. A second solution such as an alkaline solution then can remove the remaining outer photopolymer layer and opaque coating for high resolution photopatterning of the inner photopolymer layer for closely spaced wiring traces, for example, which are then formed by etching through the copper layer on the substrate. Other variations are disclosed hereinafter.

THE PREFERRED EMBODIMENTS

Figure 1:
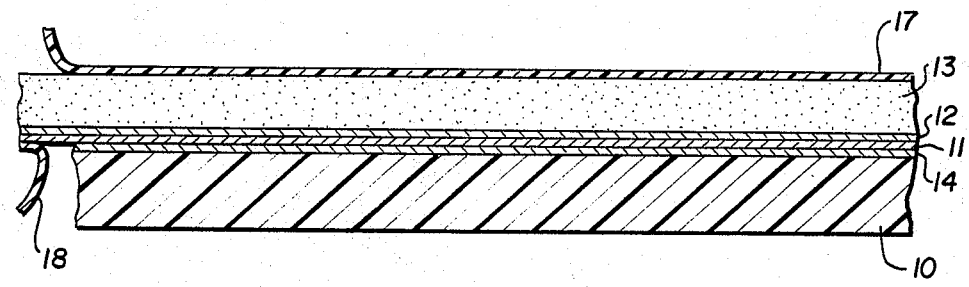
FIG. 1 is a cross section sketch through a substrate having a multi-layer film pack as provided by this invention thereon.

In FIG. 1, the substrate 10, typically a fiberglass laminate used for printed wiring boards, has a layer 14 thereover which is to receive a photo image pattern. In the case of printed wiring boards the layer 14 is a thin copper cladding layer or other metallic layer adapted to receive copper by electroplating in a later process step. In the general case the layer 14 may be any suitable surface upon which a photo pattern is to be developed. Photopolymer and corresponding photo patterns are used extensively for making offset printing plates, various graphic art products, pictures and art objects, etc. on various types of surfaces including T-shirts. This process and product could be used advantageously in other fields than printed wiring boards, used as the preferred embodiment example, whenever a dual photo treatment is desired such as two color printing, distinguishable or superimposed graphic designs, etc.

On the laminated metal clad layer 14 is positioned a thin layer of photopolymer 11, over which an opaque resin, or the like, thin layer 12 is positioned and sandwiched between the inner thin photopolymer layer 11 and a thicker outer photopolymer layer 13. The layers are cross sectioned to distinguish the fact that layers 11 and 13 have different characteristics and are not in all cases representative of the particular material used. However, the substrate 10 and two release film layers 17, 18 are sectioned to show that they are of a plastic material.

A printed wiring board unit for development of custom wiring by photoprocessing the photopolymer layers preferably constitutes the integral multiple layer assembly of fiberglass substrate 10, metal cladding 14, thin inner photopolymer layer 11, opaque resin layer 12, thick outer photopolymer layer 13 and a thin protective, preferably opaque to prevent early photo development, release film layer 17 of polypropylene, or the like. As noted on the left side, the release film 17 may be removed when the board is to be photoprocessed. For general use, a multi-layer film pack of photopolymer inner layer 11, opaque resin layer 12 and outer surface release layer 17 may be provided with an inner surface release layer 18 which is removed to position the multi-layer composite film on any suitable substrate, such as by use of a roller or squeegee, after inner surface release layer 18 is removed.

Figure 2:
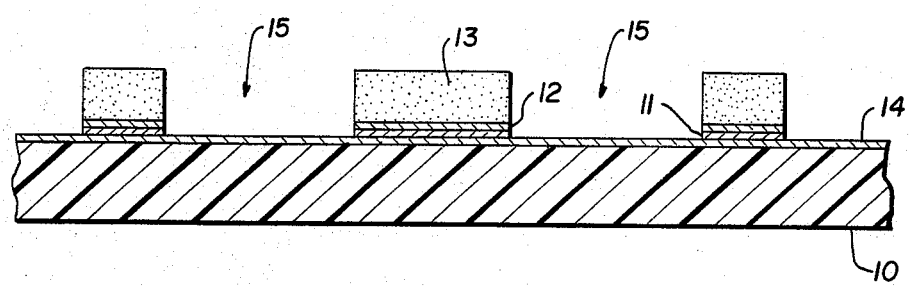
FIGS. 2 to 4 show various stages of the process afforded by this invention of producing solder masked printed circuit wiring boards starting with the composite photopolymer coating of the FIG. 1 multi-layer film pack embodiment.

FIG. 2 shows the laminate 10 assembly after the outer layer 13 has been photo exposed through a suitable photo image pattern by radiation from an U-V lamp or other source effective to act on the outer photopolymer layer 13. Thus at the positions 15, the multi-layer assembly is developed by stripping all three layers 11, 12, 13 down to the metal cladding 14 leaving intact the remaining multi-layer pattern for photoprocessing in a subsequent step.

Figure 3:
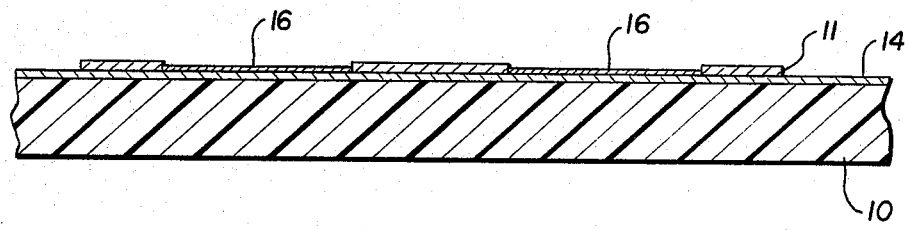

In manufacture of a custom printed wiring board, the metal clad layer 14 where not covered by the composite multi-layer photopolymer can be electroplated with tin and lead for forming a solder plating pattern as shown at 16 in FIG. 3. At this stage the two outer layers, namely photopolymer 13 and opaque resin layer 12 are stripped, leaving only the thin inner photopolymer layer 11 available for high resolution photoprocessing of a circuit trace pattern through a suitable photo image pattern.

Figure 4:
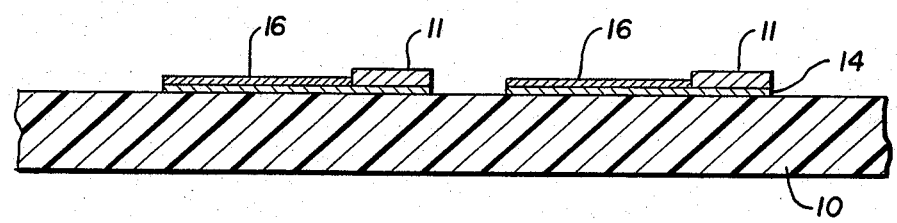

FIG. 4, with exaggerated film thickness, represents the results of this step plus an etching step to remove copper cladding layer 14 between desired circuit traces. Note that the insoluble portions of the photopolymer film layer 11 can remain on the copper cladding 14 for protection and insulation. If the layer 16 is tin-lead electroplating, it is later fused to form a solder surface at an appropriate time in the process.

The inner layer 11 being a thin etch resist layer provides manufacturers of printed wiring boards with a high resolution achievable with liquid photoresists and not attainable with the dry film photopolymers usually used having thicknesses of the order of 0.001 inch. The liquid photoresists such as CIBA-GEIGY COMPANY's "PROBIMER 48" can be applied in a thin uniform coating and dried to a thickness of 0.00025 inch, and can resolve lines and spaces down to 0.001 inch.

Another advantage is that the inner layer photopolymer can remain in place as a dry solder mask layer, and this layer can serve both as an etch resist and a permanent line solder mask.

In preparing a printed wiring board unit ready for custom manufacture of desired printed wiring patterns, a substrate, such as a metal-clad laminate 10, 14 is coated with a thin layer of a liquid negative-acting photoresist 11 and dried. An opaque polymer coating 12 is applied thereover to prevent premature inner layer exposure. An outer layer of different photopolymer 13 is coated over the opaque layer and dried.

The outer photopolymer layer 13 is exposed and developed to produce clear areas down to the substrate. The developer solution for the outer photopolymer layer dissolves three layers 11, 12, 13 where appropriate. It dissolves soluble outer layer photopolymer 13, it dissolves the opaque coating 12 in areas not covered by hardened outer layer photopolymer, and the developer also removes the inner photopolymer layer 11 where not covered by insoluble outer layer photopolymer 13. A chemical operation can now be accomplished on exposed areas of metal-cladding 14; for example, copper plating through holes and lands, followed by tin-lead plating of these same areas.

Preparatory to photopatterning the inner photopolymer layer 11, the outer layer images are stripped using an alkaline solution, and this stripping solution removes the remainder of the opaque coating, but does not significantly affect the inner layer photopolymer.

The inner photopolymer layer 11 is photopatterned to produce a second pattern of exposed substrate; for example, an etch resist pattern which will define the printed wiring traces. The second chemical operation, that of etching the metal, can now be accomplished.

In addition to the use of two layers of negative-acting photoresist to form one composite coating, a positive-acting photoresist can be combined with a negative-acting photoresist outer layer to form a composite coating which produces two photopatterns, but with fewer processing steps, as will be later explained in more detail.

In the preferred embodiment, the two photopolymer layers 11, 13 are applied to a copper-clad substrate 10, 14, the inner layer 11 being a negative-acting photopolymer that is developed in an organic solvent, and the outer layer being a negative-acting photopolymer which develops in an organic solvent and strips in an alkaline solution. The outer layer is photopattened to expose copper cladding corresponding to land areas, and the inner layer is photopatterned to coat the copper cladding with an etch resist coating.

A substrate can be coated in advance of the time to be used in printed wiring board manufacturing, and stored as an assembly. After laminate cleaning and degreasing, the inner layer 11 of CIBA-GEIGY COMPANY's "PROBIMER 48" photoresist is applied by curtain-coating to deposit a uniform coating. A bake cycle follows to drive out all solvents, leaving a hard, dry photoresist layer.

An opaque layer of resin 12 is applied over the dried PROBIMER 48, its function being to prevent the light from the outer layer exposure cycle from affecting the inner layer. The opaque layer is applied by screen printing an alkaline soluble resist which need not be photo-imaging. A suitable resist is "ER 4029" made by the COLONIAL PRINTING INK COMPANY of EAST RUTHERFORD, N.J. Using a 235 mesh screen, a dry-coating thickness of 0.5 mils will be achieved. The opaque layer is dried by baking at 200 degrees F.

The outer photopolymer layer 13 is also applied by screen printing and partially polymerized to the point of being tack free. The resist is the "CNF 1110", manufactured by M & T CHEMICALS, INC. of RAHWAY, N.J. This resist develops in an organic solvent and strips in an alkaline solution. An opaque peelable film 17 covers the photopolymer while stored.

In the preferred embodiment the coated printed wiring assembly is used to make a circuit having electroplated solder on land areas and traces of bare copper covered by a solder resist. A phototransparency is prepared having opaque areas corresponding to land areas, and is used to photo-pattern the outer layer. The developer is "XU-262", which is the proprietary developer of CIBA-GEIGY for their "PROBIMER" photoresists. This developer solution dissolves non-light exposed areas of the outer photopolymer layer 13, and this uncovers similar patterns of the opaque layer 12, which are also dissolved. Likewise, the inner layer photopolymer 11 areas underlying these developed areas are also dissolved by the developer solution.

Copper cladding so exposed is electroplated with tin-lead, thereby defining the land areas 16.

The remaining outer layer photoresist 13 is then stripped in a six-percent solution of sodium hydroxide. This solution also dissolves the remaining opaque layer 12, leaving the inner photopolymer layer 11 under the formerly unremoved outer layer 13 intact.

The inner layer photoresist 11 is photopatterned to produce a combined etch resist and solder mask covering over circuit traces. The printed wiring board is completed by etching that copper not covered by tinlead plate or etch resist, followed by infra-red fusion of tin-lead plate to form solder.

Having described a preferred embodiment, various advantages accruing through the use of the disclosed composite photopolymer layer will be described.

First, the thickness of each photopolymer layer is suited to the operation; a 1 mil thick outer plating resist layer 13 confines plated metal without metal mushrooming beyond photoresist boundaries, and a separate etch resist inner layer 11 can have a thickness of 0.25 mil (0.0001 cm) and can resolve lines and spaces of the order of 1 mil (0.0025 cm).

Second, the two photopolymer layers and opaque layer can be formed using many combinations of existing resists for special purpose applications to save processing steps, etc.

Third, the composite photopolymer layer of two negative acting layers can be used in lieu of a positive acting photoresist, with the added advantages of thicker coatings and lower cost.

Fourth, the number of steps performed by the printed wiring board manufacturer is reduced substantially, in particular several critical copper cleaning steps are eliminated which need careful control to assure high quality wiring board performances.

Previously described is a photoresist coating consisting of two separate and distinct layers having differing solubility characteristics, particularly useful in the manufacture of Printed Wiring Boards. Known negative acting photoresists, those made insoluble by exposure to light, permit only one photopatterning step, and produce only one pattern on a substrate so photo-patterned. The disclosed composite coating consists of a thick, alkaline-soluble photoresist outer layer 13, useful as a plating resist and a thin inner photopolymer layer 11 soluble in an organic solvent, useful as a high-resolution etch resist. The outer layer is photopatterned to produce one pattern of exposed substrate; for example, land areas for tin-lead electroplating. Stripping the outer layer makes the inner layer accessible for a second photopatterning step, to expose a second pattern on the substrate for a second chemical operation; for example, the second pattern can be both an etch resist and a line solder mask. Thus, the composite layers provide all the photopatterning required to manufacture printed wiring boards known as Solder Mask Over Bare Copper.

Additionally, the composite film can be made of a negative-acting photoresist outer layer over a positive resist inner layer, thereby eliminating processing steps and further improving resolution of conductor lines and spaces.

Within the field of printed wiring board manufacturing, there are two major classes of photoresists in use: positive acting and negative acting. A positive acting photoresist is one in which those areas of dried resist exposed to light become soluble in a developer. A negative acting photoresist is one in which light hardens the photopolymer and renders it insoluble.

Positive acting photoresists have the desirable characteristic of being capable of being photopatterned more than one time. Since light makes the photopolymer soluble, then one area can be exposed and developed for one chemical operation and a second photopatterning step can be done to expose other areas of the same substrate for a second chemical operation. The positive acting photoresists are capable of producing images having lines and spaces having widths equal to the resist thickness.

There are four major limitations on the use of positive acting photoresists which restrict their use in printed circuits manufacturing. First, the resist cannot be allowed to get into drilled holes, for once dried, it is difficult to get sufficient light down into the holes to render the resist soluble. Second, the resist cannot be easily applied and photoimaged in thickness greater than 0.0003 inches, thus making it difficult to use as a plating resist when metal is being deposited to 0.001 inch thickness. The third restriction is the long exposure time and energy required, which is typically twice that of negative acting resists. The fourth disadvantage is that of cost. Positive resists are three times the cost per gallon of negative resists and since the solvent content is at least 60 percent, then the cost per mil of thickness is of the order of 7.5 that of a 100 percent reactive negative acting photopolymer.

This invention has one objective, the use of two independent layers of negative acting photoresist to emulate a positive acting photoresist to provide the capability for two separate photopatterning steps with one composite layer, and without the need for substrate recoating after the first chemical operation.

A second objective is to provide in one composite coating two layers of unequal thickness; a thick layer of the order of 0.001 inch (0.0025 cm) to serve as a plating resist, and a thin inner layer of the order of 0.0004 inch (0.001 cm) thick to serve as an etch resist.

A third objective is to provide a coated metal-clad substrate assembly in which the printed wiring board manufacturing steps are largely subtractive; that is, the assembly is photopatterned and developed to produce a plating resist pattern. That pattern is stripped to uncover the inner photopolymer layer. The inner layer is photopatterned to produce the etch resist images and the metal cladding is then etched.

When a composite coating comprises a positive acting photoresist inner layer 11 and a negative acting photoresist outer layer 13, this combination allows the two chemical operations to be performed on the substrate with fewer processing steps, and provides a much higher resolution. For example, the positive acting photoresist can resolve lines and spaces equal to the layer thickness, making it feasible to resolve 1 mil (0.0025 cm) lines and spaces, and possible to resolve 0.25 mil (0.000625 cm) lines and spaces. It should be noted that more than two distinct patterns of substrate can be achieved, for as previously described the positive resists can be photopatterned multiple times.

The positive acting inner layer photoresist 11 is manufactured by the SHIPLEY COMPANY and sold as "PHOTOPOSIT 1195". It is coated onto the copper clad substrate by dipping the substrate into the resist and withdrawing at a controlled rate, typically of the order of 10 inches (25 cm) per minute. The resist is dried by a bake cycle of 30 minutes at 175 degrees F.

No opaque layer need be used with this composite.

As mentioned earlier, the exposure time required for a positive acting photoresist is typically twice that of a negative acting photoresist. By using an outer layer having a high photo speed, the outer layer can be photopatterned without adversely affecting the inner positive acting photoresist. A high photo speed is achieved by lowering the pigment content of the outer layer, which is the "CNF 1110" of M & T CHEMICALS, INC.

The processing steps are:
1. Expose the outer layer through a phototransparency to harden the field and leave land areas unexposed.
2. Expose the composite layer through a phototransparency of the line artwork, exposing the inner layer photoresist in areas other than conductor patterns, through the clear outer layer.
3. Develop outer layer in a developer solution of 80 percent trichloroethane and 20 percent isopropanol, thereby uncovering and dissolving the positive photoresist in an identical pattern.
4. Electroplate substrate patterns.
5. Strip outer layer in an alkaline solution. This stripper simultaneously develops the image in the positive resist, and the etching step can now be accomplished.

This disclosure also provides for tenting selected holes drilled in the printed wiring board laminate. Hole tenting refers to the capping of holes to prevent entry of plating chemicals and thereby prevent the plating of metal within the holes. Tenting is accomplished by applying the layer of positive-acting photopolymer onto the metal cladding and adding an opaque, removable covering. After drilling and electroless metal deposition, the opaque coverings are removed and the positive resist is photoexposed to change the solubility characteristics of areas to be etched at a later step. The positive-acting photopolymer need not be developed at this time.

Next, the outer layer photopolymer is applied so as to tent the holes. A suitable photopolymer dry film is made by several manufacturers, and this dry photopolymer is laminated over the positive-acting photoresist, thereby covering all drilled holes. A short exposure cycle hardens the outer layer over the holes to be tented and other areas excepting land areas. As previously described, the photo speed of the positive-acting photopolymer is significantly less than that of the negative-acting photopolymer, enabling the outer layer to be photoimaged without significantly affecting the inner layer photopolymer. As previously described, the outer layer is developed, and the plating operation performed, etc.

Thus, a novel method and a corresponding novel film pack is produced by this invention by laminating together two layers of photopolymer with differing solubility characteristics permitting both layers to be removed where soluble by a first developing solution after a first photoexposure step through a first photo image pattern to provide an intermediate image pattern for defining a printed wiring board, land areas or the like, and only one layer to be removed by a different developing solution where soluble after a second photoexposure in sequence through a different photo image pattern to form a finally developed image pattern such as wiring traces on a printed wiring board.

Various other combinations of the positive acting and negative acting photoresist layers of various thickness combinations provide advantage for achieving special purpose multiple step photo processing in various applications. Accordingly, those novel features of this invention believed descriptive of the spirit and nature of the invention are defined with particularity in the following claims.

I claim:
1. The method of manufacturing a photopolymer film pack for reproducing a sequence of two different images on a common surface disposed adjacent the film pack comprising laminating together on said surface two layers with an inner layer and an outer layer each being of a different photopolymer having a different solubility characteristic from the other, thereby permitting both layers to be removed simultaneously where soluble after a first sequential photoexposure through an image pattern by use of a first sequential developing solution by stripping residual portions of the outer layer only from the inner layer with a first developing solution, photoexposing the remaining inner layer through an image pattern, and removing soluble portions of the inner layer with a different developing solution, whereby two images are used to photoexpose for development in sequence the two layers thereby to produce an intermediate image pattern after the first photoexposure and development steps and a different finally developed image pattern after the second photoexposure and development steps, thereby leaving a resulting insoluble image pattern resident on the common surface.

2. The method defined in claim 1 including the step of laminating the two layers with significantly different thicknesses.

3. The method defined in claim 2 wherein the thinner one of the layers is laminated with a thickness of about 0.001 cm.

4. The method defined in claim 2 wherein the thicker layer is laminated with a thickness of about 0.0025 cm.

5. The method defined in claim 2 including the step of laminating the thinner layer of a positive acting photopolymer.

6. The method defined in claim 1 including the step of covering at least one layer of the film pack with a thin opaque release layer.

7. The method defined in claim 1 including the step of laminating one of said layers onto a flat substrate surface.

8. The method defined in claim 7 including the step of laminating a metal clad film laminated on an insulation layer to form a metal clad substrate as said common surface upon which the photopolymer layers are laminated.

9. A photopolymer film pack for reproducing a sequence of two different images on a common surface disposed adjacent the film pack, comprising in combination, two layers of laminated together different photopolymers forming inner and outer layers on a common surface with the inner and outer polymer layers having differing solubility characteristics permitting both layers to be removed in a single first sequential developing step where soluble after a first sequential photoexposure of the outer layer through an image pattern by application of a first developing solution and the inner layer to be removed thereafter by a different developing solution in a second sequential developing step after residual portions of the outer layer are removed where soluble after a second sequential photoexposure through an image pattern following the first developing step, whereby the film pack when photoexposed and developed in said sequence of steps with two images produces an intermediate image pattern on the outer polymer layer and a different finally developed permanent image pattern in residence formed from one of the images comprising unsoluble portions of the inner layer polymer following the second exposure through that one image and developing step.

10. The film pack defined in claim 9 wherein the two layers are of significantly different thicknesses.

11. The film pack of claim 10 wherein the thinner one of the layers is laminated with a thickness of about 0.001 cm.

12. The film pack defined in claim 10 wherein the thicker layer is laminated with a thickness of about 0.0025 cm.

13. The film pack defined in claim 10 wherein the thinner layer is a positive acting photopolymer.

14. The film pack defined in claim 6 including a thin opaque release layer covering one outer surface of the film pack laminated layers.

15. The film pack defined in claim 9 wherein one of the layers is laminated onto a substrate surface.

16. The film pack defined in claim 15 wherein the substrate surface comprises a metal clad film laminated on an insulating layer.

17. The multi-step exposure process of developing images by exposing photopolymer through photo image patterns comprising the steps of,
superimposing on a surface for receiving an image a set of layers comprising separate inner and outer layers of different photopolymers, having differing solubility characteristics whereby independent development of the outer and inner layers can be selected by use of different developing solutions and having the characteristics that the inner layer can be independently exposed in a second photoexposure step through a photo image pattern after the outer layer is exposed and developed,
photoexposing the outer layer with the inner layer in place thereunder through a photo image pattern to make portions thereof defined by the image soluble,
developing the image by removing the soluble photopolymer portions and the inner layer thereunder from the surface with a first developing solution leaving an inner layer pattern under the remainder of the outer layer,
stripping the outer layer portions superimposed over the inner layer pattern,
photoexposing the remaining inner layer portions through a different photo image pattern to define a second image pattern with parts of the inner layer soluble,
and developing the second image pattern by removing the soluble parts thereof from the surface with a different second developing solution.

18. The process of claim 17 including the step of depositing on said surface both the inner and outer layers of negative acting photopolymer materials.

19. The process of claim 17 including the step of depositing at least the inner layer of a positive acting photopolymer material on said surface.

20. The process of claim 17 including the step of providing higher resolution by employing a thinner inner layer and thicker outer layer therby to provide higer resolution in the photoexposure and developing steps for the second image pattern.

21. The process of printing wiring patterns on a metal layer clad laminate defining holes therethrough comprising the steps of:
coating the metal layer clad laminate as a printed wiring substrate with an inner layer of photopolymer,
applying an outer layer photopolymer over said inner layer photopolymer so as to bridge over selective holes in said substrate, said inner layer and said outer layer having differing solubility characteristics permitting one part of the outer layer to be selectively removed after photoexposure through an image pattern along with the corresponding portions of said inner photopolymer layer by one solution and permitting the remaining outer layer part to be removed by a further solution without removal of the remaining inner layer made insoluble by said photoexposure,
photoexposing the inner and outer layers through photo image patterns to produce different images on the two layers,
developing the exposed outer layer and dissolving corresponding portions of said inner layer therebeneath down to the metal clad layer with said one solution to define land areas,
electroplating the land areas,
stripping the remaining outer layer
dissolving areas of said inner layer which are soluble after photo exposure in said further solution to produce a wiring trace pattern with insoluble portions of the inner layer,
and etching the metal layer to produce the circuit wiring traces.

22. The process of printing wiring patterns on a metal layer clad laminate comprising the steps of:
coating the metal layer clad laminate as a printed wiring substrate with a separate inner layer on the metal layer and an outer layer over the inner layer, said inner and outer layers of photopolymer having solubility characteristics permitting one part of the outer layer to be selectively removed after photoexposure through an image pattern along with the corresponding portions of said inner layer by one solution and permitting the remaining outer layer part to be removed by a further solution without removal of the remaining inner layer,
photoexposing the outer layer through a photo image pattern,
developing the exposed outer layer and dissolving corresponding portions of said inner layer down to the metal clad layer with said one solution to define land areas,
electroplating the land areas with an etch resist coating,
stripping the remaining outer layer with said further solution leaving the inner layer thereunder intact,
photoexposing the inner layer through a photo image and developing it to produce an etch resist pattern uncovering the metal layer thereunder, and etching the metal layer to produce circuit wiring traces.

23. The process defined in claim 22 wherein the steps of coating the laminate with said inner and outer layers comprises providing both layers as negative acting liquid photopolymer with an opaque film therebetween removable by both said one solution and said further solution.

24. The process defined in claim 22 including the step of coating the laminate with said inner layer of a positive acting photopolymer.

25. The process of claim 24 including the step of providing the outer photopolymer layer of low-pigmented negative acting photopolymer in surface contact with the inner photopolymer layer thereby to permit photoexposure of the inner layer through the outer layer.

26. The process defined in claim 22 including the steps of electroplating the etch resist coating on said land areas with a tin-lead layer and fusing said layer to form solder.

27. The process defined in claim 26 including the step of retaining on the photopolymer inner layer a pattern in its hardened state by photoexposure in place over the metal layer after the inner layer developing step to serve as an insulating solder mask layer before the electroplating step.

28. The process defined in claim 1 including the step of coating the two photopolymer layers with different thicknesses, the inner layer being thinner than the outer layer.

* * * * *